United States Patent [19]

Poon

[11] Patent Number: 5,257,215
[45] Date of Patent: Oct. 26, 1993

[54] FLOATING POINT AND INTEGER NUMBER CONVERSIONS IN A FLOATING POINT ADDER

[75] Inventor: Jack T. Poon, Fremont, Calif.
[73] Assignee: Intel Corporation, Santa Clara, Calif.
[21] Appl. No.: 860,987
[22] Filed: Mar. 31, 1992
[51] Int. Cl.[5] ............................................. G06F 7/38
[52] U.S. Cl. ........................................ 364/745; 364/748
[58] Field of Search ............... 364/745, 748, 715.03, 364/715.04

[56] References Cited

U.S. PATENT DOCUMENTS 4,805,128  2/1989  Nelsen et al. ................. 364/715.03

*Primary Examiner*—Long T. Nguyen
*Attorney, Agent, or Firm*—Owen L. Lamb

[57] ABSTRACT

A floating point number which includes a mantissa field, an exponent field, and a sign field is converted to an integer of n-bit size including a sign bit. The sign field is examined to determine if the floating point number is a positive or negative number. The mantissa field is shifted right to thereby denormalize the mantissa resulting in a shifted mantissa. If the floating point number is a negative number, zero is subtracted from the shifted mantissa to produce a result mantissa field that is a two's complement number. Otherwise, zero is added to the shifted mantissa to produce a result mantissa field. Overflow or underflow of the result mantissa field with respect to the integer of n-bit size is detected and the sign bit is set appropriately to reflect the fact that the sign field of the floating point number is a negative or positive number.

2 Claims, 4 Drawing Sheets

FLOATING POINT AND INTEGER NUMBER CONVERSIONS IN A FLOATING POINT ADDER

CROSS REFERENCES TO RELATED APPLICATIONS

U.S. Pat. No. 5,195,051, granted Mar. 16, 1993, of Krishnan J. Palaniswami, entitled "Computation of sign Bit and Sign Extension in the Partial Products in a Floating Point Multiplier Unit," copending patent application Ser. No. 07/881,043 filed May 11, 1992, of Jonathan Sweedler, entitled "Store Rounding in a Floating Point Unit," and, copending patent application Ser. No. 07/861,077, filed Mar. 31, 1992, of Krishnan J. Palaniswami, entitled "Computation of Sticky Bit in Parallel with Partial Products in a Floating Point Multiplier Unit," all assigned to Intel Corporation, the assignee of the present invention.

BACKGROUND OF THE INVENTION

1. Field of the Invention

The present invention relates to data processing systems, and more particularly to apparatus for the conversion of floating point numbers to integers for the conversion of integers to floating point numbers in the floating-point unit of a microprocessor.

2. Description of the Related Art

U.S. Pat. No. 4,823,260 of Imel et al. describes a microprocessor and a floating-point unit in the processor that implements the IEEE microprocessor floating-point standard P754. Extended-precision floating-point calculations are performed by using 32-bit, 64-bit, and 80-bit real values.

The above-cited patent reduced the number of floating-point operations, and simplified the programming, thereby increasing the performance of the floating-point operations by providing an apparatus for performing a number of kinds of mixed-precision calculations utilizing a single-instruction op code. The advantage is that mixed-precision arithmetic is supported as well as extended-precision arithmetic. Mixed-precision arithmetic avoids extra conversion instructions, allows computation of the result to sufficient precision instead of the widest precision and does not occur double-rounding in the arithmetic operation if the intermediate result is rounded to extended precision first. It is desirable to speed up the conversion process and to reduce the logic.

It is an object of the present invention to provide a floating-point-unit in which floating-point to integer and integer to floating point conversions are done in three clock cycles.

SUMMARY OF THE INVENTION

Briefly, the above object is accomplished in accordance with the invention by providing an apparatus that will handle a floating point number which includes a mantissa field, an exponent field, and a sign field, converting to and from an integer of n-bit size including a sign bit. The sign field is examined to determine if the floating point number is a positive or negative number. The mantissa field is shifted right to thereby denormalize the mantissa, resulting in a shifted mantissa. If the floating point number is a negative number, zero is subtracted from the shifted mantissa to produce a result mantissa field that is a two's complement number. Otherwise, zero is added to the shifted mantissa to produce a result mantissa field. Overflow of the result mantissa field with respect to the n-bit size is detected and the sign bit is set appropriately to reflect the fact that the sign field of the floating point number is a negative or positive number. An exponent detection is provided to report an exponent overflow.

BRIEF DESCRIPTION OF THE DRAWINGS

The invention will be apparent from the following more particular description of the preferred embodiment of the invention as illustrated in the accompanying drawings, wherein.

DESCRIPTION OF THE PREFERRED EMBODIMENT

Figure 1:
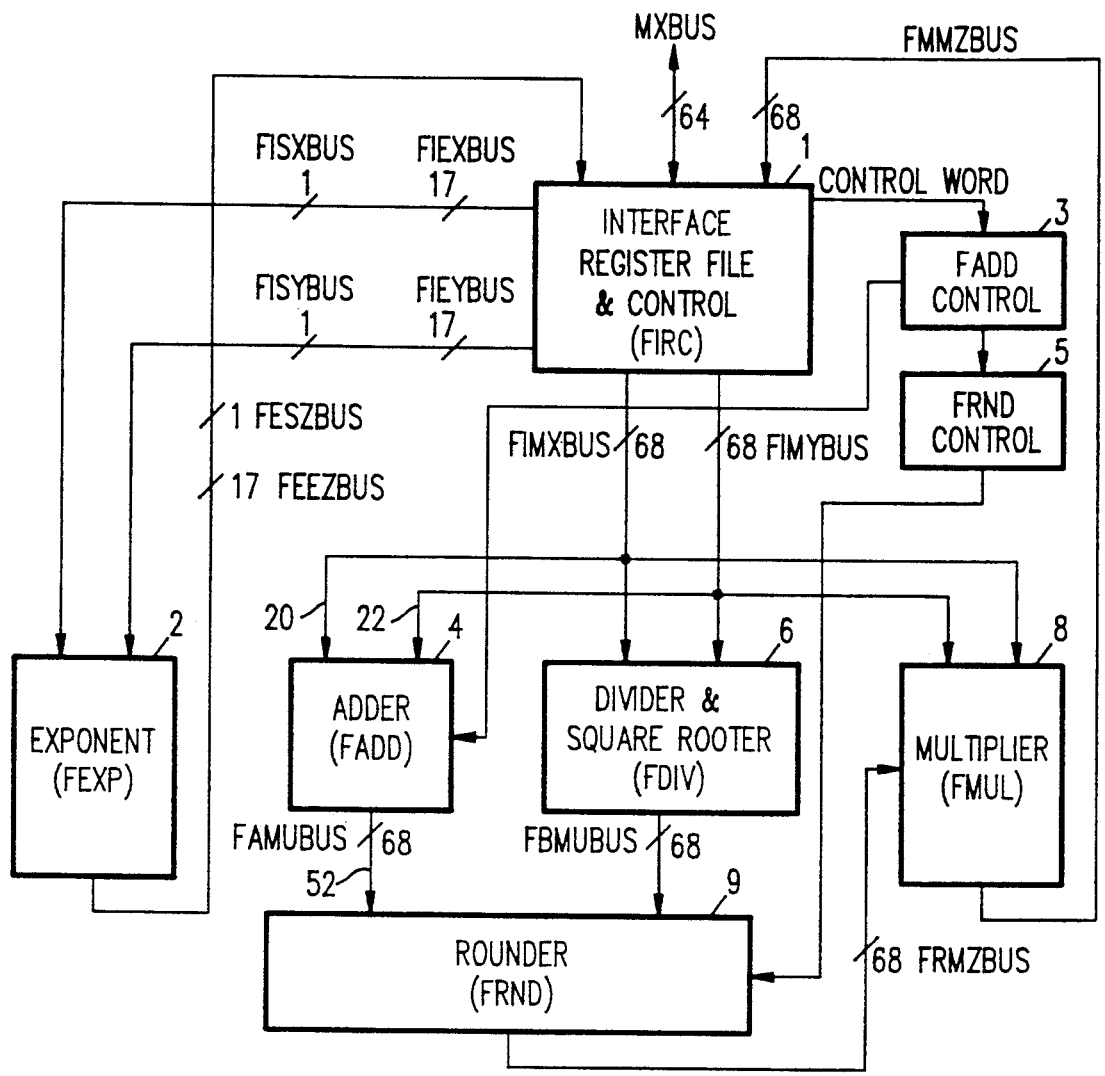
FIG. 1 is a block diagram of a floating point unit in which the invention is embodied.

FIG. 1 is a block diagram of a floating point (FP) unit in which the present invention is embodied. The floating-point unit is broken up into six sections: floating point interface, register file, and control (FIRC), multiplier (FMUL), adder (FADD), divider and square rooter (FDIV), rounder (FRND), and exponent (FEXP). These sections are described briefly below to provide background for the present invention which is embodied in the adder (FADD).

Floating-point Interface, Register file and Control (FIRC)

The Floating-point Interface, Register file and Control, or FIRC (1), contains the floating-point register stack and working registers, the FP constant ROM, the store-rounding unit, the integer interface hardware and the status word, control word and tag word registers. The FIRC can perform register-to-register transfers, simple operations such as FABS and FCHS, and other operations without the involvement of other units.

FIRC, as opposed to the other FP sections, performs operations on entire floating-point numbers (sign, exponent, and mantissa). FIRC is the only section that interfaces to the non-FP units. It gets microcode vectors from a macroinstruction sequencer in the D2 cycle. Data transfers between the FIRC and either the integer-register file or memory happen during the E stage. The FIRC passes operands and gives start signals to the other FP sections in the X1 stage. Results are written back into the register file in either the X1 or WF stages.

Multiplier (FMUL)

The multiplier or FMUL (8) multiplies two normalized mantissas, two signed integers, or two unsigned integers and is described more fully in the above referenced Ser. No. 07/861,078 now U.S. Pat. No. 5,195,051 and copending patent application Ser. No. 07/861,077. The FMUL produces a rounded product. It receives its two operands from the FIRC in the X1 stage, and it sends its rounded result to the FIRC in the WF stage. Booth encoding and partial product generation occurs in the X1 stage, the multiplier CSA tree operates during X2, and the rounding is performed in WF. It is capable of rounding to any of the three supported precisions (single, double, and extended) and it can round in any of the four rounding modes (round to nearest or even, round up, round down, or round to zero). The FRND sends its result to FMUL and FMUL selects either the FRND result or the FMUL result to be sent to the FIRC in the WF stage.

Adder FADD

The adder or FADD (4), in which the present invention is embodied, is responsible for performing the necessary operations on the mantissa during an addition, subtraction, or various other microinstructions. It can align the smaller operand and then add it to or subtract it from the other operand. It contains a right shifter, adders and a normalizer/left shifter. This hardware can be configured in different ways depending on the microinstruction being executed. The FADD delivers an unrounded result that requires no more than a 1-bit shift left or a 2-bit shift right to normalize it. FADD implements several primitive operations used in complex microcode flows and in the exception handling and also performs the integer to floating point and floating-point-to-integer conversions.

The FADD gets either one or two mantissa operands from the FIRC in X1. Its control is sent by the FEXP in the X1 and X2 stages. It performs its calculations in the X1 and X2 stages and passes its unrounded result to the FRND at the end of the X2 stage.

Divider and Square Rooter (FDIV)

The divider and square rooter or FDIV (6) can divide two mantissas or calculate the square root of one mantissa. It delivers an unrounded quotient, an exact remainder, or a square root. It receives either one or two mantissa operands from the FIRC and some control from the FEXP in the X1 cycle. All of the operations that FDIV performs are iterative and take much longer than instructions executed in either the FADD or FMUL. FDIV produces an unrounded result that is sent to the rounder (FRND) in the X2 cycle.

Rounder (FRND)

The rounder or FRND (9) performs the rounding and normalization for the FADD and FDIV sections and is described more fully in the above referenced copending patent application Ser. No. 07/881,043. The FRND operates only on the mantissa and sends its result to the FIRC section to be written to the register file. The FRND can normalize a number by shifting it left one position, right one position, or right two positions. It is capable of rounding to any of the three supported precision (single, double, and extended), and it can round in any of the four rounding modes (round to nearest or even, round up, round down, or round to zero). Both normalization and rounding can be turned off independent of each other. It gets an unrounded mantissa from the FADD or FDIV in the X2 stage and its result is sent to the FMUL in the WF stage.

Exponent (FEXP)

The exponent or FEXP (2) contains the exponent datapath. The FEXP performs most of the work concerning the exponent. FEXP can produce exponent results for any of the basic operations (add, subtract, multiply, divide, and square root). FEXP also supports the various numeric primitives used for complex instructions and generates the sign of the result for most operations. It receives its internal precision-exponent operands from the FIRC in the X1 stage and in the same cycle, generates the alignment control for FADD and for FDIV (this is for the square-root instruction). It receives a normalization count from the FADD in the X2 stage (this is a large normalization that can be larger than 2), as well as another normalization count from the FMUL and FRND (this is a small normalization that is between +2 and −1) in the WF stage. The exponent result that it calculates is sent to the FIRC in WF. FEXP also checks for overflow and underflow of the result.

Figure 2:
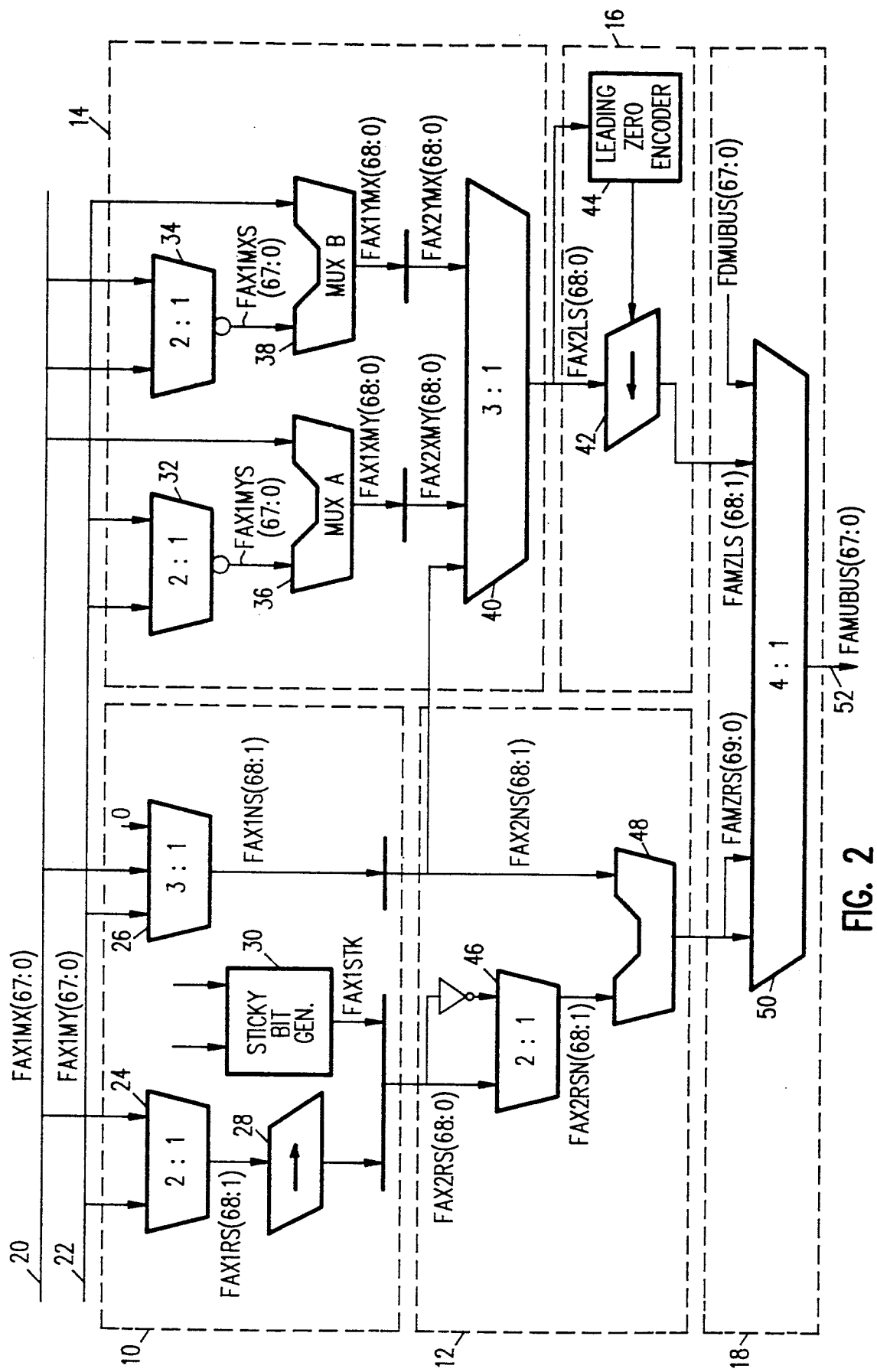
FIG. 2 is a block diagram of the floating point adder shown in FIG. 1.

FIG. 2 is a block diagram of the floating point adder (4) shown in FIG. 1, which consists of five blocks as shown by the broken lines. The right shifter block (10) is the right shifter used to align the mantissa. The adder block (12) is the mantissa adder in the X2 stage. The adder block (14) is the mantissa adder in the X1 stage. The left shifter block (16) is the left shifter used to normalize the result. The mantissa is said to be in normal representation when it has an integer bit of one. Block (18) is the mantissa adder interface to other parts of the floating point unit. The blocks (10 and 12) are the data path that supports true addition in all exponent difference cases and subtraction when the exponent difference is greater than one. The blocks (14 and 16) are the data path that supports true subtraction when the exponent difference is equal to zero or one.

Figure 3:
FIG. 3 is a diagram of the Intel 80486 microprocessor real number three-field binary format.

The Intel 80486 microprocessor stores real numbers in a three-field binary format (shown in FIG. 3) similar to exponential notation. The significant bits of the number are stored in a significand field. An exponent field locates the binary point within the significant digits to determine the number's magnitude. A sign field indicates whether the number is positive or negative.

An extended precision number in floating point consists of a 15-bit exponent, a 64-bit mantissa and a 1-bit sign. The logic can take this extended precision number and convert it to a 16-bit, 32-bit, or 64-bit integer number. A floating-point number has a larger range than the corresponding integer. This means that there can be an integer overflow.

A twos-complement number is a number which is derived by reversing all of the binary digits in the number and adding 1. For a twos-complement number, whenever there is a 1 in the most-significant bit position, the operation that is done is an inversion and the addition of a 1. Since floating point has a bigger range an algorithm is used to detect the overflow condition.

Figure 4:
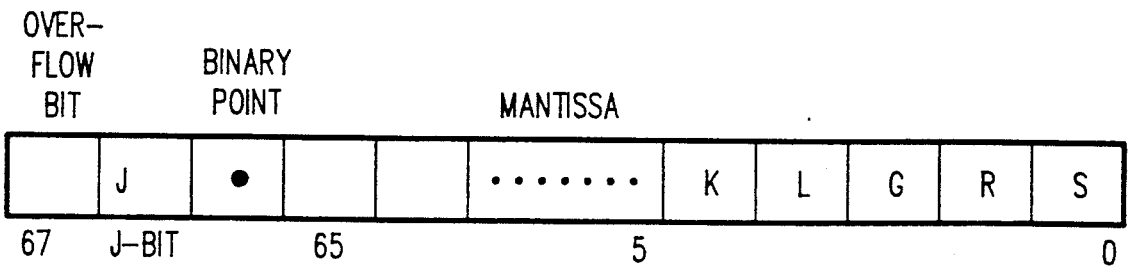
FIG. 4 is a diagram for extended precision floating point number format.

For extended precision, the floating point number has the format shown in FIG. 4.
Where:
Bit 67 is the Mantissa over-flow bit
J-bit is the bit to the left of the binary point
L-bit is the mantissa least significant bit.
K-bit is the next bit to the left of the L-bit.
GRS-bits are the guard, round, and sticky bits used to perform rounding.

In this specification the term "biased exponent" is used to mean that a constant is added to the true exponent of a real number to obtain the exponent field of that number's floating point representation. This insures that the biased exponent is always interpreted as an unsigned, positive number.

A constant, Z is defined as follows:
Z=1003EH-biased exponent

FLOATING POINT NUMBER TO INTEGER CONVERSION

Positive FP Number to Integer Conversion
Case I: $Z \geq 0$
In this case the FP number is within range for conversion to the 64-bit integer, but it may still overflow due to rounding.
Case II: $Z < 0$
In this case the FP number is too large for conversion to the 64-bit integer, and since it is outside range for conversion to the 64-bit integer the logic signals integer overflow. The integer is indefinite and converts to the most negative 64-bit number.

FP number is positive:

|   | Mantissa....\|GRS |
|---|---|
| 1. mantissa | 1.XXXX...X\|000 |
| 2. shift right by Z | 0.001XX...X\|XXX |
| 3. round according to rounding mode specified in the control word | |

FP Number to Integer Conversion (Negative Number)
FP number is negative:

|   | Mantissa....\|GRS |
|---|---|
| 1. mantissa | 1.XXXX...X\|000 |
| 2. shift right by Z | 0.001XX..X\|XXX |
| 3. take complement | 1.110XX..X\|XXX |
| 4. add one | 0.0000000000000001 |
| 5. round according to rounding table (TABLE II) | |

Rounding Modes
The IEEE microprocessor floating-point standard P754 defines four rounding modes:
chop (round toward zero).
round up (round toward + infinity)
round down (round toward − infinity)
round to nearest or even

TABLE I

| | Rounding Mode is Set to Nearest Even | | | |
|---|---|---|---|---|
| LGS | EVEN | DOWN | UP | CHOP |
| 000 | −2 | −2 | −2 | −2 |
| 001 | −2 | −3 | −2 | −2 |
| 010 | −2 | −3 | −2 | −2 |
| 011 | −3 | −3 | −2 | −2 |
| 101 | −1 | −3 | −1 | −1 |
| 100 | −1 | −1 | −1 | −1 |
| 110 | −2 | −2 | −1 | −1 |
| 111 | −2 | −2 | −1 | −1 |

In the case of FP to integer conversion, the rounding control is changed to round down when the number is negative and the rounding control from the FIRC is set to chop or round up. The rounding control is changed to chop in the case where the sign is negative and the rounding mode is set to round down.

TABLE II

| | Rounding Mode is set to Chop or Round Up | | | |
|---|---|---|---|---|
| LGS | EVEN | DOWN | UP | CHOP |
| 000 | +2 | +2 | +2 | +2 |
| 001 | +2 | +3 | +2 | +2 |
| 010 | +2 | +3 | +2 | +2 |
| 011 | +3 | +3 | +2 | +2 |
| 101 | +1 | +3 | +1 | +1 |
| 100 | +1 | +1 | +1 | +1 |
| 110 | +2 | +2 | +1 | +1 |
| 111 | +2 | +2 | +1 | +1 |

Over Flow

For conversion of a 16, 32 or 64 bit two's complement integer to an extended floating point number, the integer is always representable in floating point.

| Integer Overflow condition During Integer to Floating-Point Conversion: | |
|---|---|
| Width of Integer | Condition for integer overflow |
| 16 | ExpY $\geq$ H1000E |
| 32 | ExpY $\geq$ H1001E |
| 64 | ExpY $\geq$ H1003E |

FLOATING POINT NUMBER TO INTEGER CONVERSION
Example for Primitive Floating-Point to Integer Conversion (Positive Number)

| | Exponent | Mantissa |
|---|---|---|
| X1:ADJUST | X: H1003E | X: H???????????????? |
| | Y: H0FFFF | Y: H4000000000000008 (sign = 0) |
| X2:PASS | Z: H00000 | Z: H0000000000000009 |
| | Z: H00000 | Z: H0000000000000009 |
| WF:ROUND FRND) | Z: H00000 | Z: H0000000000000008 |

In the right shifter (10) a 2:1 multiplexer (24) selects mantissa Y so that the operand can use the right shifter (28) to denormalize the mantissa. The floating point adder makes the assumption that a constant H1003E is forced onto the exponent X. This is done so that an exponent logic (2) of FIG. 1 can generate the appropriate control signal to energize the right shifter (28).

In the X2 adder (12), the integer from multiplexer (46) enters adder (48) and is added to 0 from multiplexer (26) in order to pass the result through the X2 stage. Since the floating-point number can be within the range 1.0 and 0.0, it is possible that the resulting integer can be 0. However, this is a strong function of rounding. This means that the floating point adder must preserve the guard, round, and sticky bits for appropriate rounding. Furthermore, the exponent unit (2) shown in FIG. 1 also needs to detect overflow. Because the floating-point number represents a larger range than the integer, the floating-point number may not be able to be represented in integer format. This calls for an internal special situation. An exception handler writes the largest negative integer into the result.

Example for Floating-Point to Integer Conversion (Negative Number)

When the number is negative, the operation is similar to that shown above for a positive number, the difference being that the number is represented in negative two's complement format. This is done by performing a binary subtraction in the X2 stage.

| For a 16 bit number: | |
|---|---|
| Exponent | Mantissa |
| X: H1003E | X: H???????????????? |
| Y: H0FFFF | Y: H4000000000000008 (sign = 0) |

X1:ADJUST

|  | For a 16 bit number: | |
|---|---|---|
|  | Exponent | Mantissa |
| X2:COMPLEMENT | Z: H0FFFF | Z: H0000000000000009 |
| WF:ROUND | Z: H0FFFF | Z: HFFFFFFFFFFFFFFF7 |
| (FRND) | Z: H0FFFF | Z: HFFFFFFFFFFFFFFF8 |

In right shifter (10) the 2:1 multiplexer (24) selects mantissa Y (22) so that the operand can use the right shifter (28) to denormalize the mantissa (22). The floating point adder makes the assumption that a constant H1003E is forced onto the exponent X. This is done so that the exponent unit (2) shown in FIG. 1 can generate the appropriate control for the right shifter (28).

In X2 adder (48), 0 is subtracted from the shifted mantissa in order to generate a two's-complemented negative integer. Again, the floating point adder must preserve the guard, round, and sticky bits for appropriate rounding. Rounding is done on the two's complement number, which is different from what is specified in the IEEE standard P754. The same type of overflow and underflow detection is done as in the positive integer case.

Flow chart of FP Number to Integer Conversion

Figure 5:
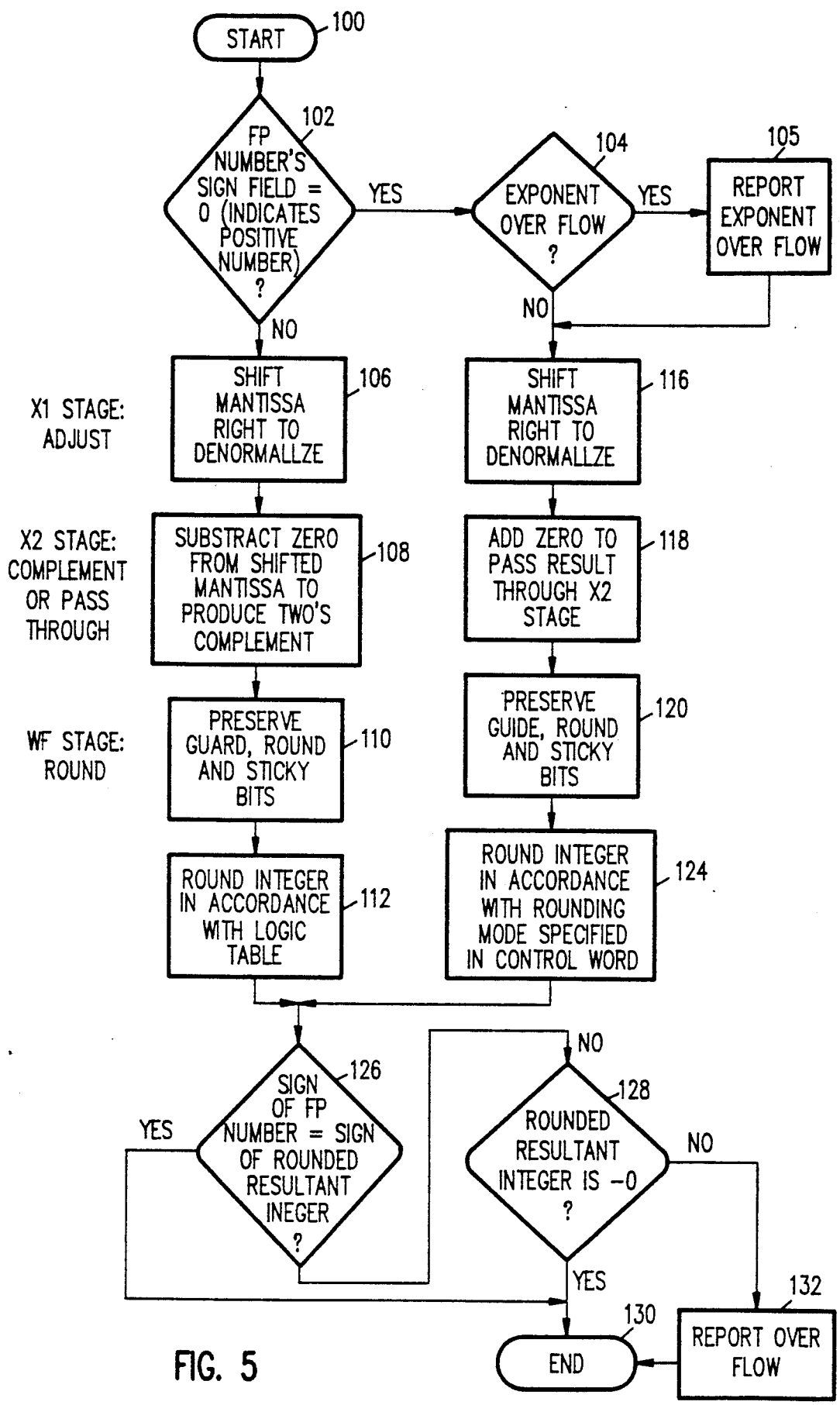
FIG. 5 is a flow chart of the floating point number to integer conversion in the adder shown in FIG. 1 and, FIG. 6 is a flow chart of the integer to floating point number conversion in the adder shown in FIG. 1.

FIG. 5 is a flow chart of the floating point number to integer conversion in the adder shown in FIG. 1. If at decision block (102), is the sign field of the FP number indicates that it is a negative number, then in the X1 stage the mantissa is shifted right to denormalize the mantissa (106), and the number is represented in negative two's complement format. This is done by performing a binary subtraction in the X2 stage (block 108). The floating point adder preserves the guard, round, and sticky bits for appropriate rounding (block 110). The number is rounded in accordance with the rounding logic shown in TABLE II.

At decision block (102), if the sign field of the FP number indicates that it is a positive number, then at decision block (104) if exponent over flow is detected, then the over flow condition is reported (105). In the X1 stage the mantissa is shifted right to denormalize the mantissa (116).

In the X2 stage the integer from multiplexer (46) is added to 0 in order to pass the result through the X2 stage (block 118). Since the floating-point number can be within the range 1.0 and 0.0, it is possible that the resulting integer can be 0, so the floating point adder must preserve the guard, round, and sticky bits for appropriate rounding (block 120). The integer is rounded (124) in accordance with the rounding mode specified in the control word, in the FADD control (3) shown in FIG. 1.

If the sign of the FP number is not equal to the sign of the rounded result, then overflow is reported (132).

A negative zero is a special case that is not an overflow condition even in the case where the sign of the FP number and the sign of the rounded integer differ.

INTEGER TO FLOATING POINT NUMBER CONVERSION

16-bit Case (Positive number)

1. Shift the leading 1 of the integer to the most significant bit (MSB) of the floating point (FP) number.
2. FP biased exponent = 1003E-number of left shifts.
3. Result is the correct FP number, no rounding is necessary.
4. Set the sign bit to zero

16-bit Case (Negative number)

1. Take the two's complement and consider the sign.
2. Zero out all of the upper bits that are not within the 16bit number.
3. Shift the leading 1 of the integer to the most significant bit (MSB) of the floating point (FP) number.
4. FP biased exponent = 1003E-number of left shifts.
5. Result is the correct FP number, no rounding is necessary.
6. Set the sign bit to one to reflect the fact that this is a negative FP number.

Examples for Primitive Integer to Floating-Point Conversion (Positive Integer)

Primitive integer to floating point conversion converts a floating point number to a two's complemented integer. The integer width can be either 16, 32, or 64.

|  | Exponent | Mantissa |
|---|---|---|
|  | H: H????0 | X: H0000000000000000 |
|  | Y: H????0 | Y: H0000000000000020 (d4) |
| X1:SUBTRACT |  |  |
|  | Z: H1003E | Z: H0000000000000020 |
| X2:NORMALIZE |  |  |
|  | Z: H10000 | Z: H8000000000000000 |
| WF:POST-NORMALIZE |  |  |
|  | Z: H10001 | Z: H4000000000000000 (sign = 0) |

The floating point adder makes the assumption that the least-significant bit of the exponents are equal and mantissa X (20) is 0. In the X1 stage, X1 adder (14) performs the operation (0 minus Y) and (Y minus 0). Since the integer is positive, then (Y minus 0) is selected. This is to ensure a positive number is selected because floating point is in sign-magnitude format.

In the X2 adder (12), the exponent data path forces in a constant H1003E to be the common exponent. Then the left shifter logic block (16) normalizes the integer. The amount of mantissa adjustment is reflected onto the common exponent. In WF stage, the converted floating-point number is rounded to extended precision. Since the integer width is bounded by the floating-point width, no rounding would actually take place.

Example for Primitive Integer to Floating-Point Conversion (Negative Number)

|  | Exponent | Mantissa |
|---|---|---|
|  | H: H????0 | X: H0000000000000000 |
|  | Y: H????0 | Y: H000000000000FFFE0 (−d4) |
| X1:SUBTRACT |  |  |
|  | Z: H1003E | Z: H0000000000000020 |
| X2:NORMALIZE |  |  |
|  | Z: H10000 | Z: H8000000000000000 |
| WF:POST-NORMALIZE |  |  |
|  | Z: H10001 | Z: H4000000000000000 (sign = 1) |

The same assumption is made as when the integer is positive. In the X1 adder (14) performs (0 minus Y) and (Y minus 0). Since the integer is negative, (0 minus Y) is selected. This is to ensure a positive number is selected because floating point is in sign-magnitude format.

In the X2 adder (12), the exponent data path forces in a constant H1003E to be the common exponent. Then the left shifter (42) normalizes the integer. The amount of mantissa adjustment is reflected onto the common exponent. In WF stage the converted floating-point number is rounded to extended precision. Since the integer width is bounded by the floating-point width, no rounding would actually take place. The control logic block (1) of FIG. 1 makes the final sign negative instead of positive.

Flow chart of Integer to FP Number Conversion

Figure 6:
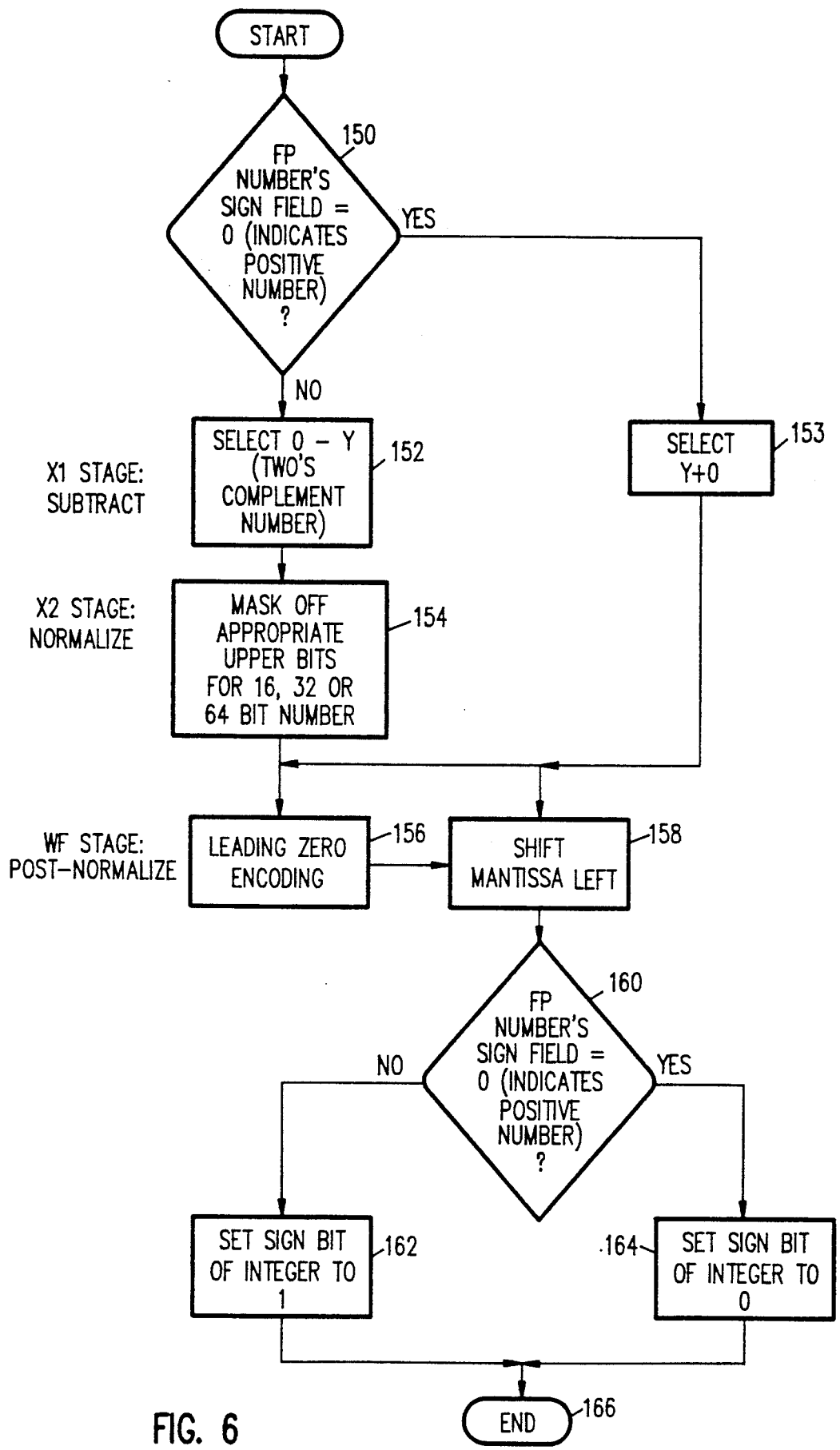

FIG. 6 is a flow chart of the integer to floating point number conversion in the adder shown in FIG. 1. If at decision block (150) the sign field of the FP number indicates that it is a negative number, then in the X1 stage the mantissa represented in negative two's complement format is selected.

At block (154) the appropriate (for either 16, 32, or 64 bit number) upper bits of the number are forced to zero by a mask.

If at decision block (150), if the sign field of the FP number indicates that it is a positive number, then at the two's complement number is not selected (153).

In the WF stage the leading zero encoder output (156) is used to perform the appropriate left shift of the mantissa (158). Finally, if the FP number sign field indicates a positive number (160) then the sign bit is set to one (164), otherwise it is set to zero (164).

While the invention has been particularly shown and described with reference to preferred embodiments thereof, it will be understood by those skilled in the art that the foregoing and other changes in form and detail may be made therein without departing from the scope of the invention.

What is claimed is:

1. Apparatus for converting from a floating point number which includes a mantissa field, an exponent field, and a sign field to an integer of n-bit size including a sign bit, in accordance with a control word specifying a particular rounding mode, comprising:

floating point number storage means for storing said floating point number;

control word storage means for storing said control word;

first means for shifting said mantissa field right to thereby denormalize said mantissa resulting in a shifted mantissa;

second means connected to said first means for subtracting zero from said shifted mantissa to produce a first result mantissa field that is a two's complement number, upon the condition that said sign field indicates that said floating point number is a negative number;

said second means including third means for adding zero to said shifted mantissa to produce a second result mantissa field, upon the condition that said sign field indicates that said floating point number is a positive number;

fourth means connected to said second means for detecting overflow of said result mantissa field with respect to said integer of n-bit size;

fifth means connected to said floating point number storage means and to said second means for setting said sign bit of said integer to reflect the fact that said sign field of said floating point number is a negative or positive number, and, sixth means connected to said second means and to said control word storage means for rounding said integer in accordance with a rounding mode specified in said control word provided that said sign field indicates that said floating point number is a positive number and for rounding said integer in accordance with a logic table provided that said sign field indicates that said floating point number is a negative number.

2. Apparatus for converting from a floating point number which includes a mantissa field, an exponent field, and a sign field to an integer of n-bit size including a sign bit, in accordance with a control word specifying a particular rounding mode, comprising:

a floating point number register for storing said floating point number;

control word register for storing said control word;

a right shifter for shifting said mantissa field right to thereby denormalize said mantissa resulting in a shifted mantissa;

a logic unit connected to said right shifter for subtracting zero from said shifted mantissa to produce a first result mantissa field that is a two's complement number, upon the condition that said sign field indicates that said floating point number is a negative number;

said logic unit including an adder for adding zero to said shifted mantissa to produce a second result mantissa field, upon the condition that said sign field indicates that said floating point number is a positive number;

an overflow detector connected to said logic unit for detecting overflow of said result mantissa field with respect to said integer of n-bit size;

fifth means connected to said floating point number register and to said logic unit for setting said sign bit of said integer to reflect the fact that said sign field of said floating point number is a negative or positive number, and, a rounder connected to said adder and to said control word register for rounding said integer in accordance with a rounding mode specified in said control word provided that said sign field indicates that said floating point number is a positive number and for rounding said integer in accordance with a logic table provided that said sign field indicates that said floating point number is a negative number.

* * * * *